United States Patent
Tsai et al.

(10) Patent No.: US 11,238,908 B2
(45) Date of Patent: *Feb. 1, 2022

(54) MEMORY CIRCUIT AND METHOD OF OPERATING SAME

(71) Applicant: Taiwan Semiconductor Manufacturing Company, Ltd., Hsinchu (TW)

(72) Inventors: Jui-Che Tsai, Tainan (TW); Cheng Hung Lee, Hsinchu (TW); Shih-Lien Linus Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/076,965

(22) Filed: Oct. 22, 2020

(65) Prior Publication Data

US 2021/0043239 A1   Feb. 11, 2021

Related U.S. Application Data

(63) Continuation of application No. 16/204,396, filed on Nov. 29, 2018, now Pat. No. 10,818,327.

(Continued)

(51) Int. Cl.
*G11C 11/4076*   (2006.01)
*G11C 11/4094*   (2006.01)
(Continued)

(52) U.S. Cl.
CPC ............... *G11C 7/22* (2013.01); *G11C 7/06* (2013.01); *G11C 7/1045* (2013.01); *G11C 7/12* (2013.01);
(Continued)

(58) Field of Classification Search
CPC ........... G11C 7/22; G11C 7/06; G11C 7/1045; G11C 7/12; G11C 7/18; G11C 11/4076; G11C 11/4094
(Continued)

(56) References Cited

U.S. PATENT DOCUMENTS 6,091,624 A   7/2000 Kang
6,292,417 B1  9/2001 Seyyedy
(Continued)

FOREIGN PATENT DOCUMENTS

TW   1282551   6/2007

OTHER PUBLICATIONS

Office Action dated Jun. 26, 2020 from corresponding application No. KR 10-2019-0024631.

*Primary Examiner* — Ly D Pham
(74) *Attorney, Agent, or Firm* — Hauptman Ham, LLP

(57) ABSTRACT

A memory circuit includes a first memory cell, a second memory cell and a sense amplifier. The sense amplifier is coupled to the first memory cell by a first bit line, and coupled to the second memory cell by a second bit line. The sense amplifier includes a header switch, a footer switch, a first cross-coupled inverter and a second cross-coupled inverter. The header switch has a first size, and is coupled to a first node and a first supply voltage. The footer switch has a second size, and is coupled to a second node and a second supply voltage. The first size is greater than the second size. The first size includes a first number of fins or a first channel width. The second size includes a second number of fins or a second channel width.

20 Claims, 7 Drawing Sheets

Related U.S. Application Data

(60) Provisional application No. 62/691,745, filed on Jun. 29, 2018.

(51) Int. Cl.
*G11C 7/06* (2006.01)
*G11C 7/10* (2006.01)
*G11C 7/12* (2006.01)
*G11C 7/18* (2006.01)
*G11C 7/22* (2006.01)
*G11C 11/419* (2006.01)

(52) U.S. Cl.
CPC ............ *G11C 7/18* (2013.01); *G11C 11/4076* (2013.01); *G11C 11/4094* (2013.01); *G11C 11/419* (2013.01)

(58) Field of Classification Search
USPC ........................................................ 365/203
See application file for complete search history.

(56) References Cited

U.S. PATENT DOCUMENTS

| | | |
|---|---|---|
| 6,344,990 B1 | 2/2002 | Matsumiya et al. |
| 8,300,450 B2 | 10/2012 | Christensen et al. |
| 9,947,391 B1 | 4/2018 | Mahatme et al. |
| 9,947,393 B2 | 4/2018 | Yabuuchi et al. |
| 2001/0033508 A1 | 10/2001 | Waller |
| 2001/0046178 A1 | 11/2001 | Suzuki |
| 2011/0141814 A1 | 6/2011 | Abiko |
| 2014/0269110 A1 | 9/2014 | Yang et al. |
| 2018/0102163 A1 | 4/2018 | Lin et al. |

US 11,238,908 B2

MEMORY CIRCUIT AND METHOD OF OPERATING SAME

PRIORITY CLAIM AND CROSS-REFERENCE

The present application is a continuation of U.S. application Ser. No. 16/204,396, filed Nov. 29, 2018, now U.S. Pat. No. 10,818,327 issued Oct. 27, 2020, which claims the benefit of U.S. Provisional Application No. 62/691,745, filed Jun. 29, 2018, which are herein incorporated by reference in their entireties.

BACKGROUND

The semiconductor integrated circuit (IC) industry has produced a wide variety of digital devices to address issues in a number of different areas. Some of these digital devices, such as memory macros, are configured for the storage of data. As ICs have become smaller and more complex, the resistance of conductive lines within these digital devices are also changed affecting the operating voltages of these digital devices and overall IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
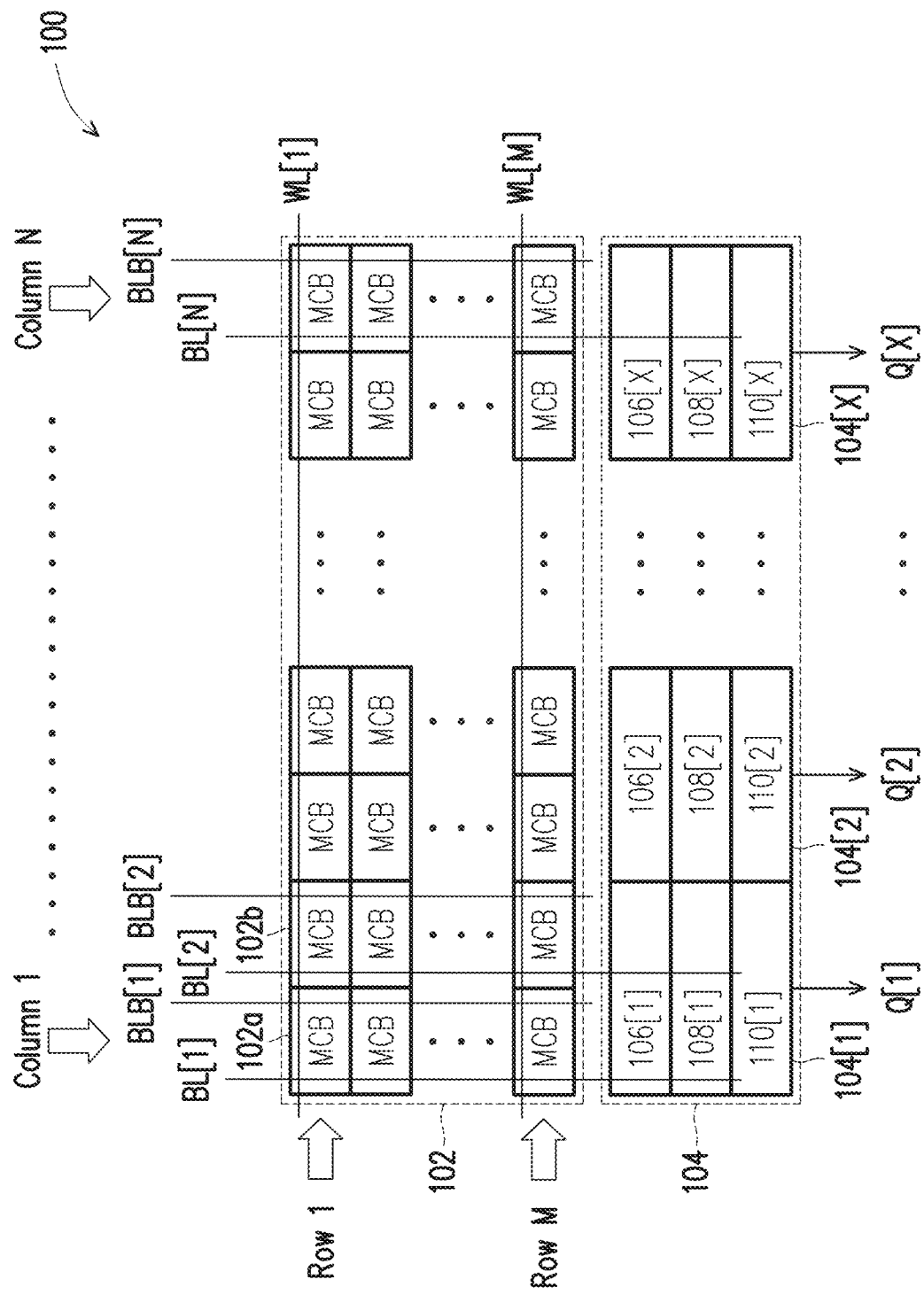
FIG. 1 is a circuit diagram of a memory circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory circuit includes a first memory cell, a second memory cell, a pre-charge circuit and a sense amplifier. The pre-charge circuit is coupled to a first bit line and a second bit line. The pre-charge circuit is configured to charge the first bit line and the second bit line to a pre-charge voltage level responsive to a first signal. The sense amplifier is coupled to the first memory cell by the first bit line, and coupled to the second memory cell by the second bit line. The sense amplifier is responsive to a second signal and a third signal.

In some embodiments, process voltage and temperature (PVT) variations between the first memory cell and the second memory cell cause a difference in the discharge speed between the first bit line and the second bit line. In some embodiments, the sense amplifier is configured to generate a random sequence based on PVT variations between the first and second memory cell. In some embodiments, the sense amplifier is configured to determine which of the first and second memory cell and the corresponding first and second bit line discharges towards a supply reference voltage faster based on PVT variations between the first and second memory cell.

In some embodiments, the sense amplifier includes a first set of N-type transistors having a first size, and a second set of P-type transistors having a second size. In some embodiments, the second size is greater than or equal to the first size.

In some embodiments, the sense amplifier includes a header switch and a footer switch. In some embodiments, the size of the header switch is greater than or equal to the size of the footer switch. In some embodiments, by using the sense amplifier of the present disclosure, the read margin is improved compared with other approaches.

Memory Circuit

FIG. 1 is a circuit diagram of a memory circuit 100, in accordance with some embodiments. In the embodiment of FIG. 1, memory circuit 100 is a static random access memory (SRAM) circuit. SRAM is used for illustration, and other types of memories are within the scope of various embodiments.

Memory circuit 100 comprises a memory cell array 102 having M rows and N columns of memory cells MCB, where N is a positive integer corresponding to the number of columns in memory cell array 102 and M is a positive integer corresponding to the number of rows in memory cell array 102. The rows of cells in memory cell array 102 are arranged in a first direction X. The columns of cells in memory cell array 102 are arranged in a second direction Y. The second direction Y is different from the first direction X. In some embodiments, the second direction Y is perpendicular to the first direction X. Memory cell 102a is a single memory cell in column 1 and row 1 of memory cell array 102. Memory cell 102b is a single memory cell in column 2 and row 1 of memory cell array 102. In some embodiments, each memory cell MCB in memory cell array 102 is configured to store a bit of data. In some embodiments, memory circuit 100 is logic based memory.

The number of rows M in memory cell array 102 is equal to or greater than 1. The number of columns N in memory cell array 102 is equal to or greater than 2. In some embodiments, memory cell array 102 includes one or more single port (SP) SRAM cells. In some embodiments, memory cell array 102 includes one or more dual port (DP) SRAM cells. Different types of memory cells in memory cell array 102 are within the contemplated scope of the present disclosure.

Memory circuit 100 further includes N bit lines BL[1], . . . BL[N] (collectively referred to as "bit line BL") and N bit line bars BLB[1], . . . BLB[N] (collectively referred to as "bit line bar BLB"). Each column 1, . . . , N in memory cell array 102 is overlapped and coupled to a corresponding bit line BL[1], . . . , BL[N] and a corresponding bit line bar BLB[1], . . . , BLB[N]. Each bit line BL or bit line bar BLB extends in the second direction Y and over a column of cells (e.g., column 1, . . . , N).

In some embodiments, the term "bar" indicates a logically inverted signal. In these embodiments, for example, bit line bar BLB[1], . . . BLB[N] carries a signal logically inverted from a signal carried by bit line BL[1], . . . BL[N].

Memory circuit 100 further includes M word lines WL[1], . . . WL[M] (collectively referred to as "word line WL"). Each row 1, . . . , M in memory cell array 102 is overlapped and coupled to a corresponding word line WL[1], . . . , WL[M]. Each word line WL extends in the first direction X and over a row of cells (e.g., row 1, . . . , M).

Memory circuit 100 further includes an input output (IO) circuit 104 coupled to memory cell array 102. IO circuit 104 is configured to read or write data to or from memory cell array 102. In some embodiments, IO circuit 104 is configured to generate a random code sequence or set of random data (e.g., set of output data Q) based on data stored in memory cell array 102. IO circuit 104 includes one or more IO circuits 104[1], 104[2], . . . , 104[X] arranged in an array having 1 row and X columns of IO circuits, where X is a positive integer corresponding to the number of columns in IO circuit 104 and is expressed by formula 1.

$$X=N/2 \quad (1)$$

Each column in IO circuit 104 corresponds to a pair of columns in memory cell array 102. For example, columns 1 and 2 in memory cell array 102 correspond to column 1 in IO circuit 104.

Each IO circuit 104[1], 104[2], . . . , 104[X] is configured to input or output corresponding data Q[1], Q[2], . . . , Q[X] (collectively referred to as "set of output data Q"). Each IO circuit 104[1], 104[2], . . . , 104[X] is coupled to a corresponding pair of memory cells in memory cell array 102 by a corresponding pair of bit lines BL. Each IO circuit 104[1], 104[2], . . . , 104[X] is overlapped by a pair of bit lines BL. Other configurations of the IO circuit 104 are within the scope of the present disclosure.

Each IO circuit 104[1], 104[2], . . . , 104[X] includes a corresponding sense amplifier 106[1], 106[2], . . . , 106[X] (collectively referred to as "set of sense amplifiers 106"), a corresponding latch circuit 108[1], 108[2], . . . , 108[X] (collectively referred to as "set of latch circuits 108") and a corresponding pre-charge and equalization circuit 110[1], 110[2], . . . , 110[X] (collectively referred to as "set of pre-charge and equalization circuits 110").

Each sense amplifier 106[1], 106[2], . . . , 106[X] is coupled to a corresponding pair of memory cells in memory cell array 102 by a corresponding pair of bit lines BL. For example, in some embodiments, sense amplifier 106[1] is coupled to memory cell 102a by bit line BL[1], and coupled to memory cell 102b by bit line BL[2].

In some embodiments, each sense amplifier 106[1], 106[2], . . . , 106[X] is not coupled to bit line bars BLB. For example, in some embodiments, sense amplifier 106[1] is not coupled to bit line bars BLB[1] and BLB[2].

At least one sense amplifier 106[1], 106[2], . . . , 106[X] is configured to sense or read data stored in a pair of memory cells of memory cell array 102 through a bit line split between a corresponding pair of bit lines BL. For example, in some embodiments, sense amplifier 106[1] is configured to sense or read data stored in memory cells 102a and 102b through a bit line split between corresponding bit lines BL[1] and BL[2]. Other configurations of the set of sense amplifiers 106 are within the scope of the present disclosure.

At least one latch circuit 108[1], 108[2], . . . , 108[X] is configured to output corresponding data Q[1], Q[2], . . . , Q[X] received from a corresponding sense amplifier 106[1], 106[2], . . . , 106[X].

Each latch circuit 108[1], 108[2], . . . , 108[X] is coupled to a corresponding sense amplifier 106[1], 106[2], . . . , 106[X] by a corresponding bit line of bit lines BL. For example, in some embodiments, latch circuit 108[1] is coupled to sense amplifier 106[1] by a portion of bit line BL[1]. Other configurations of the set of latch circuits 108 are within the scope of the present disclosure.

Each pre-charge and equalization circuit 110[1], 110[2], . . . , 110[X] is coupled to a corresponding pair of bit lines BL. For example, in some embodiments, pre-charge and equalization circuit 110[1] is coupled to bit lines BL[1] and BL[2].

At least one pre-charge and equalization circuit 110[1], 110[2], . . . , 110[X] is configured to pre-charge and equalize the corresponding pair of bit lines BL to a value of supply voltage VDD. For example, in some embodiments, pre-charge and equalization circuit 110[1] is configured to pre-charge and equalize bit lines BL[1] and BL[2] to a predetermined voltage level. In some embodiments, the predetermined voltage level corresponds to a logical value, such as a logical high value or a logical low value. In some embodiments, the predetermined voltage level corresponds to a value of a supply voltage VDD, or reference voltage VSS. Other configurations of the set of pre-charge and equalization circuits 110 are within the scope of the present disclosure.

In some embodiments, memory circuit 100 also includes other circuits (e.g., driver circuits, timing circuits, etc.) that are not described for simplicity.

In some embodiments, by using one or more of sense amplifiers 106[1], 106[2], . . . , 106[X], memory circuit 100 has better read margin than other approaches.

Memory Cell

Figure 2:
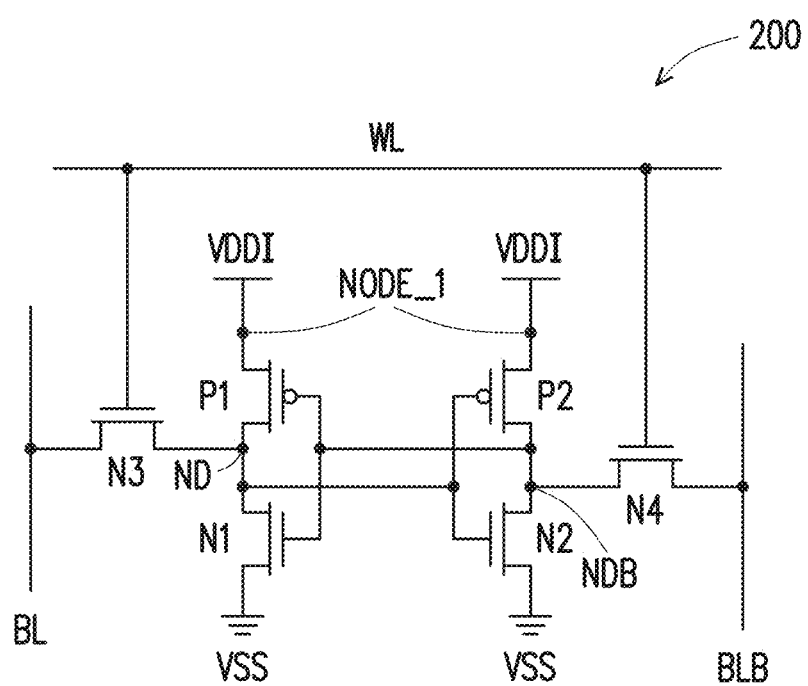
FIG. 2 is a circuit diagram of a memory cell usable in FIG. 1, in accordance with some embodiments.

FIG. 2 is a circuit diagram of a memory cell 200 usable in FIG. 1, in accordance with some embodiments.

Memory cell 200 is usable as one or more memory cells MCB in memory cell array 102 of FIG. 1.

Memory cell 200 is a six transistor (6T) single port (SP) SRAM memory cell used for illustration. In some embodiments, memory cell 200 employs a number of transistors other than six. Other types of memory are within the scope of various embodiments.

Memory cell 200 comprises two P-type metal oxide semiconductor (PMOS) transistors P1 and P2, and four N-type metal oxide semiconductor (NMOS) transistors N1, N2, N3, and N4. Transistors P1, P2, N1, and N2 form a cross latch or a pair of cross-coupled inverters. For example, PMOS transistor P1 and NMOS transistor N1 form a first inverter while PMOS transistor P2 and NMOS transistor N2 form a second inverter.

A source terminal of each of PMOS transistors P1 and P2 are configured as a voltage supply node NODE_1. Each voltage supply node NODE_1 is coupled to a first voltage source VDDI. A drain terminal of PMOS transistor P1 is coupled with a drain terminal of NMOS transistor N1, a gate terminal of PMOS transistor P2, a gate terminal of NMOS transistor N2, and a source terminal of NMOS transistor N3, and is configured as a storage node ND.

A drain terminal of PMOS transistor P2 is coupled with a drain terminal of NMOS transistor N2, a gate terminal of PMOS transistor P1, a gate terminal of NMOS transistor N1, and a source terminal of NMOS transistor N4, and is configured as a storage node NDB. A source terminal of each of NMOS transistors N1 and N2 is configured as a supply reference voltage node (not labelled) having a supply reference voltage VSS. The source terminal of each of NMOS transistors N1 and N2 is also coupled to supply reference voltage VSS.

A word line WL is coupled with a gate terminal of each of NMOS transistors N3 and N4. Word line WL is also called a write control line because NMOS transistors N3 and N4 are configured to be controlled by a signal on word line WL in order to transfer data between bit lines BL, BLB and corresponding nodes ND, NDB.

A drain terminal of NMOS transistor N3 is coupled to a bit line BL. A drain terminal of NMOS transistor N4 is coupled to a bit line BLB. Bit lines BL and BLB are configured as both data input and output for memory cell 200. In some embodiments, in a write operation, applying a logical value to a first bit line BL and the opposite logical value to the other bit line BLB enables writing the logical values on the bit lines to memory cell 200. Each of bit lines BL and BLB is called a data line because the data carried on bit lines BL and BLB are written to and read from corresponding nodes ND and NDB.

Word line WL corresponds to one or more word lines WL[1], WL[2], . . . , WL[M] in FIG. 1. Bit line BL corresponds to one or more bit lines BL[1], BL[2], . . . , BL[N] in FIG. 1. Bit line bar BLB corresponds to one or more bit line bars BLB[1], BLB[2], . . . , BLB[N] in FIG. 1.

Figure 3:
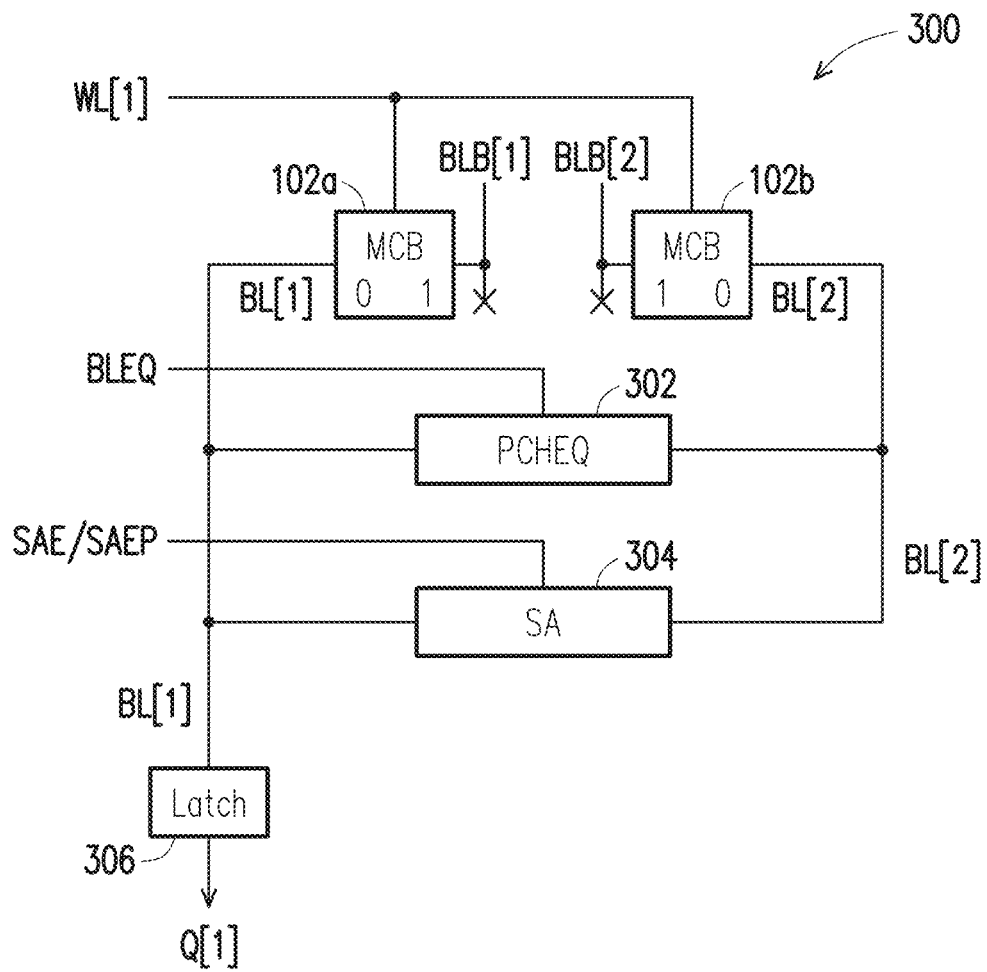
FIG. 3 is a circuit diagram of a memory circuit usable in FIG. 1, in accordance with some embodiments.

FIG. 3 is a circuit diagram of a memory circuit 300 usable in FIG. 1, in accordance with some embodiments. Components that are the same or similar to those in one or more of FIGS. 1-5 are given the same reference numbers, and detailed description thereof is thus omitted.

Memory circuit 300 is usable as a portion of memory circuit 100. For example, memory circuit 300 includes two columns (e.g., Columns 1-2) of memory cell array 102 and one column of IO circuit 104 (FIG. 1). In some embodiments, memory circuit 300 is usable as other columns of memory array 102 and IO circuit 104.

Memory circuit 300 includes columns 1 and 2 of memory cell array 102 and column 1 of IO circuit 104. Memory circuit 300 includes word line WL[1], bit lines BL[1] and BL[2], bit line bars BLB[1] and BLB[2] and memory cells 102a and 102b from memory circuit 100 of FIG. 1.

Memory circuit 300 is configured to generate the set of output data Q. In some embodiments, the set of output data Q is a random sequence of bits unique to memory circuit 300. In some embodiments, memory circuit 300 is a physically unclonable function (PUF) security system. In some embodiments, memory circuit 300 is configured to generate the set of output data Q based on process voltage and temperature (PVT) variations between memory cell 102a and 102b.

Word line WL[1] is coupled to memory cells 102a and 102b. Word line WL[1] is configured to receive a word line signal WL'.

Bit line BL[1] and bit line bar BLB[1] are each coupled to memory cell 102a. Bit line BL[2] and bit line bar BLB[2] are each coupled to memory cell 102b. At least one end of bit line bar BLB[1] or bit line bar BLB[2] is electrically floating. Bit line BL[1] or BL[2] is configured to receive a corresponding bit line signal BL1' or corresponding bit line signal BL2'. In some embodiments, bit line bar BLB[1] or BLB[2] is configured to receive a corresponding bit line bar signal BLB1' or corresponding bit line signal BLB2'.

Memory circuit 300 further includes a pre-charge and equalization circuit 302, a sense amplifier 304 and a latch circuit 306. Pre-charge and equalization circuit 302, sense amplifier 304 and latch circuit 306 correspond to IO circuit 104[1] of FIG. 1.

Pre-charge and equalization circuit 302 is pre-charge and equalization circuit 110[1] of FIG. 1. In some embodiments, pre-charge and equalization circuit 302 is usable as one or more of pre-charge and equalization circuits 110[2], . . . , 110[X] in FIG. 1.

Sense amplifier 304 is sense amplifier 106[1] of FIG. 1. In some embodiments, sense amplifier 404 is usable as one or more of sense amplifiers 106[2], . . . , 106[X] in FIG. 1.

Latch circuit 306 is latch circuit 108[1] of FIG. 1. In some embodiments, latch circuit 306 is usable as one or more of latch circuits 108[2], . . . , 108[X] in FIG. 1.

Pre-charge and equalization circuit 302 is coupled to bit lines BL[1] and BL[2]. Pre-charge and equalization circuit 302 is configured to receive a signal BLEQ. Pre-charge and equalization circuit 302 is configured to pre-charge and equalize a pair of bit lines (e.g., bit lines BL[1] and BL[2]) to a predetermined voltage level responsive to signal BLEQ. In some embodiments, the predetermined voltage level corresponds to a logical value, such as a logical high value or a logical low value. In some embodiments, the predetermined voltage level corresponds to a value of a supply voltage VDD, or reference voltage VSS.

In some embodiments, pre-charge and equalization circuit 302 is coupled to bit line bars BLB[1] and BLB[2], and is configured to pre-charge and equalize a pair of bit line bars (e.g., bit line bars BLB[1] and BLB[2]) to the predetermined voltage level responsive to signal BLEQ. Other configurations of pre-charge and equalization circuit 302 are within the scope of the present disclosure.

Sense amplifier 304 is configured to receive at least sense amplifier enable signal SAEP or SAE. Sense amplifier 304 is enabled or turned on responsive to at least sense amplifier enable signal SAEP or SAE.

Sense amplifier 304 is coupled to a corresponding pair of memory cells by a corresponding pair of bit lines BL. For example, sense amplifier 106[1] is coupled to memory cell 102a by bit line BL[1], and coupled to memory cell 102b by bit line BL[2]. Sense amplifier 304 is not coupled to bit line bars BLB[1] and BLB[2].

In some embodiments, sense amplifier 304 is configured to sense or read data stored in memory cells 102a and 102b through a bit line split between corresponding bit lines BL[1] and BL[2].

In some embodiments, the bit lines BL[1] and BL[2] are not coupled to sense amplifier 304. In some embodiments, bit line bars BLB[1] and BLB[2] are coupled to sense amplifier 304, and sense amplifier 304 is configured to sense or read data stored in memory cells 102a and 102b through a bit line bar split between corresponding bit line bars BLB[1] and BLB[2]. Other configurations of sense amplifier 304 are within the scope of the present disclosure.

Latch circuit 306 is coupled to sense amplifier 304 by bit line BL[1]. Latch circuit 306 is configured to output data Q[1] received from sense amplifier 304. Other configurations of latch circuit 306 are within the scope of the present disclosure.

Figure 4:
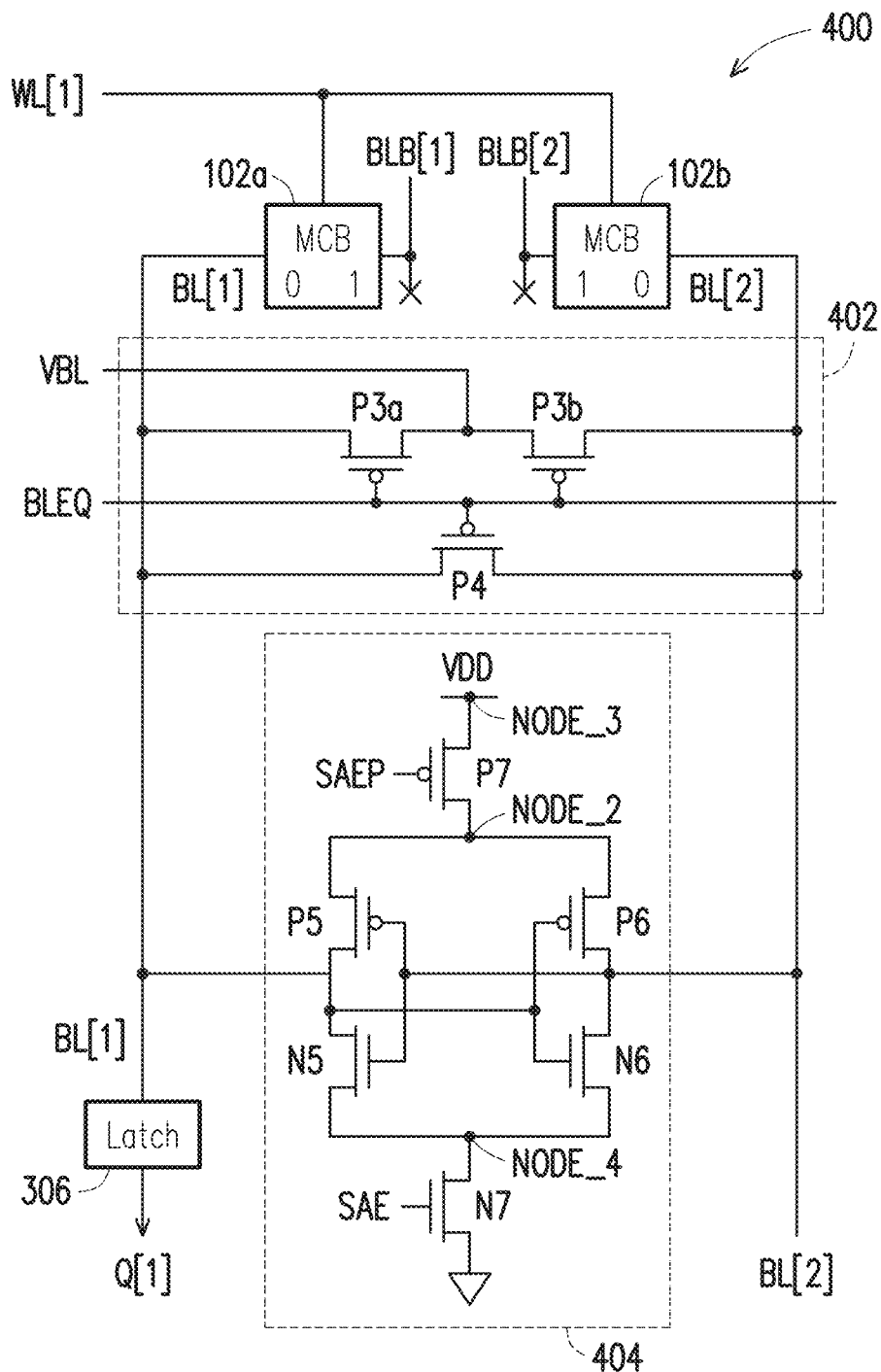
FIG. 4 is a circuit diagram of a memory circuit usable in FIG. 3, in accordance with some embodiments.

FIG. 4 is a circuit diagram of a memory circuit 400 usable in FIG. 3, in accordance with some embodiments.

Memory circuit 400 is an embodiment of memory circuit 300 of FIG. 3. In comparison with memory circuit 300 of FIG. 3, pre-charge and equalization circuit 402 replaces pre-charge and equalization circuit 302 of memory circuit 300, and sense amplifier 404 replaces sense amplifier 304 of memory circuit 300.

Pre-charge and equalization circuit 402 is an embodiment of pre-charge and equalization circuit 302 of FIG. 3. In some embodiments, pre-charge and equalization circuit 402 is usable as one or more of pre-charge and equalization circuits 110[1], 110[2], . . . , 110[X] in FIG. 1.

Sense amplifier 404 is an embodiment of sense amplifier 304 of FIG. 3. In some embodiments, sense amplifier 404 is usable as one or more of sense amplifiers 106[1], 106[2], . . . , 106[X] in FIG. 1.

Pre-charge and equalization circuit 402 is configured to pre-charge and equalize bit lines BL[1] and BL[2] to a voltage VBL responsive to a signal BLEQ. In some embodiments, voltage VBL is equal to a supply voltage VDD. In some embodiments, voltage VBL is equal to a supply reference voltage VSS.

Pre-charge and equalization circuit 402 comprises three PMOS transistors P3a, P3b and P4. PMOS transistors P3a and P3b are a pre-charge circuit. PMOS transistors P3a and P3b are configured to pre-charge bit lines BL[1] and BL[2] to voltage VBL responsive to signal BLEQ. PMOS transistor P4 is an equalization circuit. PMOS transistor P4 is configured to equalize the voltage of bit lines BL[1] and BL[2] to voltage VBL responsive to signal BLEQ. Gates of PMOS transistors P3a, P3b and P4 are coupled together, and configured to receive signal BLEQ. In some embodiments, signal BLEQ is at least a pre-charge signal or an equalization signal.

Sources of PMOS transistors P3a and P3b are coupled with bit lines BL[1] and BL[2], respectively. Drains of PMOS transistors P3a and P3b are coupled together and are configured to receive voltage VBL. For example, when signal EQB is applied with a low logical value, transistors P3a and P3b are turned on, and pull corresponding bit lines BL[1] and BL[2] to a voltage level of voltage VBL. As a result, bit lines BL[1] and BL[2] are pre-charged to a voltage level of voltage VBL.

PMOS transistor P4 is coupled between bit lines BL[1] and BL[2]. A source of PMOS transistor P4 is coupled with bit line BL[1]. A drain of PMOS transistor P4 is coupled with bit line BL[2]. For example, when signal EQB is applied with a low logical value, transistor P4 is turned on, and couples bit line BL[1] to bit line BL[2]. As a result, the voltage of bit lines BL[1] and BL[2] are equalized to the voltage level of voltage VBL. In some embodiments, the drain and the source of each of PMOS transistors P3a, P3b and P4 are used interchangeably.

Other configurations of pre-charge and equalization circuit 402 are within the scope of the present disclosure. One or more of PMOS transistors P3a, P3b and P4 is used to pre-charge and/or equalize bit lines BL[1] and BL[2] is for illustration. Other circuits and/or other types of transistors, such as NMOS transistors, or quantities of transistors, are used to pre-charge and/or equalize bit lines BL[1] and BL[2] are within the scope of various embodiments. Other values of voltage VBL are within the scope of various embodiments.

Sense amplifier 404 is configured to sense or read data stored in memory cells 102a and 102b of memory cell array 102 through a bit line split between corresponding bit lines BL[1] and BL[2].

Sense amplifier 404 comprises three PMOS transistors P5, P6 and P7, and three NMOS transistors N5, N6 and N7. Transistors P5, P6, N5, and N6 form a cross latch or a pair of cross-coupled inverters. For example, PMOS transistor P5 and NMOS transistor N5 form a first inverter while PMOS transistor P6 and NMOS transistor N6 form a second inverter.

Each of a drain terminal of PMOS transistor P5, a drain terminal of NMOS transistor N5, a gate terminal of PMOS transistor P6, and a gate terminal of NMOS transistor N6, are coupled together at node ND1. Node ND1 is coupled with bit line BL[1]. In some embodiments, node ND1 is configured as a storage node. The drain terminals of each of PMOS transistor P5 and NMOS transistor N5 and the gate terminals of each of PMOS transistor P6 and NMOS transistor N6 are coupled to bit line BL[1].

A drain terminal of PMOS transistor P7 is coupled to a source terminal of each of PMOS transistors P5 and P6 at a node NODE_2. A source terminal of PMOS transistor P7 is configured as a voltage supply node NODE_3. Voltage supply node NODE_3 is coupled to the first supply voltage VDD. A gate terminal of PMOS transistor P7 is configured to receive a sense amplifier signal SAEP. In some embodiments, PMOS transistor P7 is referred to as a "header switch."

Each of a drain terminal of PMOS transistor P6, a drain terminal of NMOS transistor N6, a gate terminal of PMOS transistor P5, and a gate terminal of NMOS transistor N5, are coupled together at node ND2. Node ND2 is coupled with bit line BL[2]. In some embodiments, node ND2 is configured as a storage node. The drain terminals of each of PMOS transistor P6 and NMOS transistor N6 and the gate terminals of each of PMOS transistor P5 and NMOS transistor N5 are coupled to bit line BL[2].

A drain terminal of NMOS transistor N7 is coupled to a source terminal of each of NMOS transistors N5 and N6 at a node NODE_4. A source terminal of NMOS transistor N7 is configured as a supply reference voltage node (not labelled) having a supply reference voltage VSS. A gate terminal of NMOS transistor N7 is configured to receive a sense amplifier enable signal SAE. In some embodiments, sense amplifier enable signal SAE is inverted from sense amplifier enable signal SAEP. In some embodiments, NMOS transistor N7 is referred to as a "footer switch."

In some embodiments, sense amplifier 404 is enabled when sense amplifier enable signal SAEP is a low logical value, and sense amplifier enable signal SAE is a high logical value. For example, when sense amplifier enable signal SAEP is applied to PMOS transistor P7 with a low logical value, PMOS transistor P7 turns on, and pulls node NODE_2 toward a voltage level of supply voltage VDD.

Similarly, for example, when sense amplifier enable signal SAE is applied to NMOS transistor N7 with a high logical value, NMOS transistor N7 turns on, and pulls node NODE_4 toward a voltage level of supply reference voltage VSS. As a result, the sense amplifier 404 is enabled and is configured to amplify the voltage level at bit lines BL[1] and BL[2], and is configured to output a read data output to latch circuit 306.

PVT variations between memory cell 102a and 102b cause a difference in the discharge speed between bit line BL[1] and BL[2]. In some embodiments, sense amplifier 404 is configured to determine which memory cell 102a and 102b and corresponding bit line BL[1] and BL[2] discharges towards supply reference voltage VSS faster based on PVT variations between memory cell 102a and 102b. In some embodiments, sense amplifier 404 is configured to output a low logical value if memory cell 102a and BL[1] discharge towards supply reference voltage VSS faster than memory cell 102b and bit line BL[2]. In some embodiments, sense amplifier 404 is configured to output a high logical value if memory cell 102a and BL[1] discharge towards supply reference voltage VSS slower than memory cell 102b and bit line BL[2]. In some embodiments, the PVT variations between memory cell 102a and 102b causing different discharge speeds between bit line BL[1] and BL[2] are used by the sense amplifier to generate a bit of data Q[1] of a random sequence (e.g., output signal Q). In some embodiments, each generated bit of data is part of a larger random sequence of data (e.g., set of output data Q) generated by IO circuit 104 of FIG. 1 useable in a PUF application or security system.

In some embodiments, one or more of PMOS transistors P5, P6 or P7 is characterized as a "big PMOS transistor." In some embodiments, one or more of NMOS transistors N5, N6 or N7 is characterized as a "big NMOS transistor." In some embodiments, a big PMOS transistor has a size equal to or greater than a size of a big NMOS transistor. In some embodiments, at least the big NMOS transistor or the big PMOS transistor is a Fin field-effect transistor (FinFET) having one or more fins or fingers. In some embodiments, a fin is referred to as a finger. In some embodiments, a size of a big PMOS transistor includes at least a channel width of the big PMOS transistor or a number of fins of the big PMOS transistor. In some embodiments, a size of a big NMOS transistor includes at least a channel width of the big NMOS transistor or a number of fins of the big NMOS transistor. In some embodiments, a big PMOS transistor has a number of fins ranging from about 16 fins to about 100 fins. In some embodiments, a big PMOS transistor has a channel width ranging from about 800 nm to about 8000 nm. In some embodiments, a big NMOS transistor has a number of fins ranging from about 16 fins to about 100 fins. In some embodiments, a big NMOS transistor has a channel width ranging from about 800 nm to about 8000 nm.

In some embodiments, bit line bars BLB[1] and BLB[2] are coupled to sense amplifier 404, and the bit lines BL[1] and BL[2] are not coupled to sense amplifier 404. Other configurations of sense amplifier 404 are within the scope of the present disclosure. PMOS transistors P5, P6 and P7 or NMOS transistors N5, N6 and N7 are for illustration. Other circuits and/or other types of transistors, such as NMOS transistors or PMOS transistors, can be substituted for the other, and are within the scope of various embodiments. Other types of signals SAEP or SAE are within the scope of various embodiments.

In some embodiments, by using sense amplifier 404 as part of a PUF application, a bias point of sense amplifier 404 is shifted compared with other approaches. For example, in some embodiments, the bias point of sense amplifier 404 is substantially equal to the supply voltage VDD divided by 2 (e.g., VDD/2) which is lower than other approaches. In some embodiments, when the sense amplifier 404 is turned on, the bias point of the sense amplifier 404 is reduced to be less than or equal to Vdd/2 compared to other approaches. In some embodiments, sense amplifier 404 is turned on after the voltage of bit lines BL[1] or BL[2] is less than VDD/2, thus shifting the bias point of sense amplifier 404 to be lower than other approaches. In some embodiments, sense amplifier 404 is turned on after the voltage of bit lines BL[1] or BL[2] is less than or equal to a threshold voltage Vth of one or more of PMOS transistors P5, P6 or P7, thus shifting the bias point of sense amplifier 404. In other words, sense amplifier 404 is configured to have a bias point less than the threshold voltage Vth of sense amplifier 404.

By using PMOS transistor P7 as a header switch, initial data stored at nodes ND1 and ND2 in sense amplifier 404 does not fight with data on the corresponding bit lines BL[1] and BL[2] since PMOS transistor P7 is turned off while the data split between bit lines BL[1] and BL[2] develops (before turning on sense amplifier 404). Thus, when sense amplifier 404 is turned on by sense amplifier enable signals SAE and SAEP, bit line BL[1] or BL[2] is discharged towards reference voltage VSS faster than other approaches resulting in better read margin.

By using larger PMOS transistors in sense amplifier 404 and the header switch (e.g., PMOS transistor P7) compared to other approaches, when sense amplifier 404 is enabled by sense amplifier enable signals SAE and SAEP, the PMOS transistors P5, P6 and P7 are able to pull bit line BL[1] or BL[2] towards the supply voltage VDD faster than other approaches resulting in better read margin.

Latch Circuit

Figure 5:
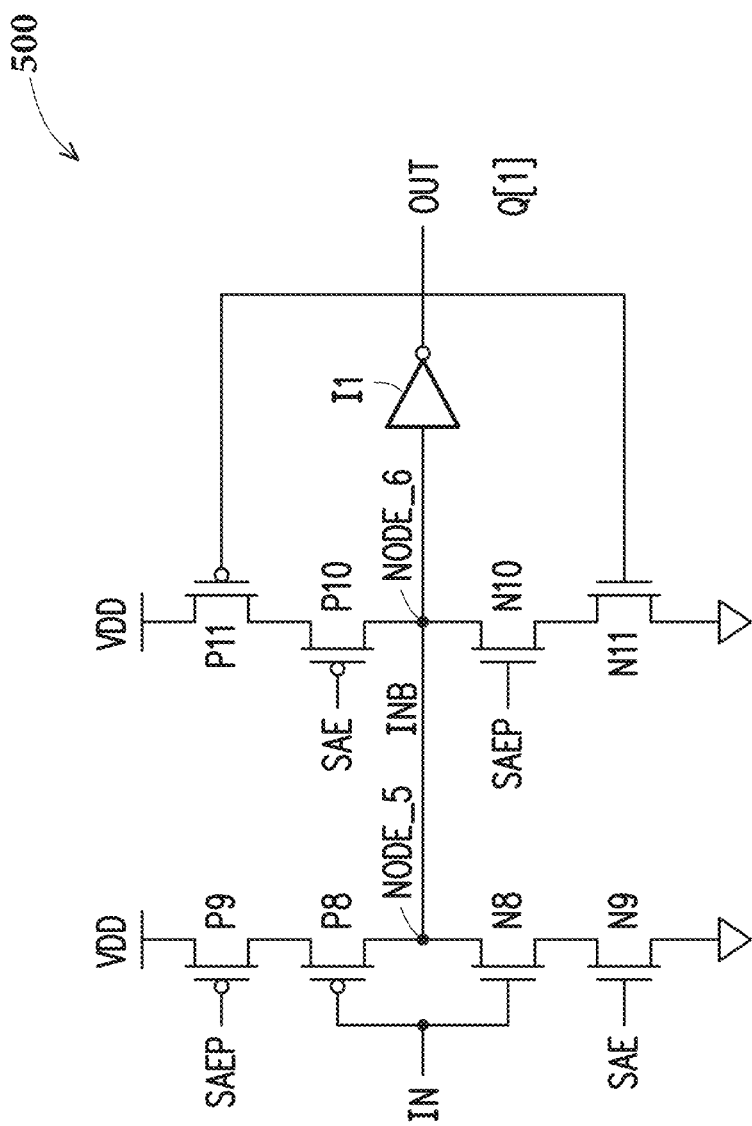
FIG. 5 is a circuit diagram of a latch circuit usable in FIG. 3, in accordance with some embodiments.

FIG. 5 is a circuit diagram of a latch circuit 500 usable in FIG. 3, in accordance with some embodiments.

Latch circuit 500 is an embodiment of latch circuit 306 of FIG. 3 or FIG. 4. In some embodiments, latch circuit 500 is usable as one or more of latch circuits 108[1], 108[2], . . . , 108[X] in FIG. 1.

Latch circuit 500 is configured to store the logical state of signal IN. Latch circuit 500 is configured to receive signal IN and sense amplifier enable signals SAE and SAEP, and to output signal OUT responsive to sense amplifier enable signal SAE and sense amplifier enable signal SAEP. Signal IN corresponds to the voltage of bit line BL[1] of FIG. 4. Signal OUT corresponds to data Q[1] of FIG. 4.

In some embodiments, latch circuit 500 is configured to store the logical state of signal IN after the sense amplifier is enabled by sense amplifier enable signals SAE and SAEP. In some embodiments, output signal OUT corresponds to the logical state of signal IN after the sense amplifier is enabled by sense amplifier enable signals SAE and SAEP.

In some embodiments, signal IN corresponds to the voltage of one or more bit line BL[1], BL[2], . . . , BL[N] of FIG. 1. In some embodiments, signal OUT corresponds to one or more data of the set of data Q of FIG. 1.

Latch circuit 500 includes NMOS transistors N8, N9, N10 and N11, PMOS transistors P8, P9, P10 and P11 and an inverter I1.

A gate of PMOS transistor P8 and a gate of NMOS transistor N8 are coupled together, and are configured to receive an input signal IN. Input signal IN turns PMOS transistor P8 off or on, and turns NMOS transistor N8 on or off, respectively.

A drain of PMOS transistor P8 is coupled with a drain of NMOS transistor N8 at node NODE_5.

A source of PMOS transistor P8 is coupled with a drain of PMOS transistor P9. A source of PMOS transistor P9 is coupled to and receives supply voltage VDD. A gate of PMOS transistor P9 is configured to receive sense amplifier enable signal SAEP. Sense amplifier enable signal SAEP turns on or off PMOS transistor P9.

A source of NMOS transistor N8 is coupled with a drain of NMOS transistor N9. A source of NMOS transistor N9 is coupled to and receives supply reference voltage VSS. A gate of NMOS transistor N9 is configured to receive sense amplifier enable signal SAE. Sense amplifier enable signal SAE turns on or off NMOS transistor N9.

In some embodiments, when sense amplifier enable signal SAE is logically high, then sense amplifier enable signal SAEP is logically low, and vice versa.

PMOS transistor P8 and NMOS transistor N8 are configured to output signal INB. In some embodiments, signal INB is inverted from signal IN. When PMOS transistor P9 and NMOS transistor N9 are turned on, PMOS transistor P8 and NMOS transistor N8 have an inverter like configuration, and signal INB is inverted from signal IN. For example, when sense amplifier enable signal SAEP is logically low causing PMOS transistor P9 to be on thereby coupling the source of PMOS transistor P8 to supply voltage VDD, and when sense amplifier enable signal SAE is logically high causing NMOS transistor N9 to be on thereby coupling the source of NMOS transistor N8 to reference voltage VSS. As a result, when input signal IN is logically low, then PMOS transistor P8 is turned on, and node NODE_5 is pulled to supply voltage VDD by PMOS transistors P8 and P9, and signal INB is logically high. In contrast, when input signal IN is logically high, then NMOS transistor N8 is turned on, and node NODE_5 is pulled to reference voltage VSS by NMOS transistors N8 and N9, and signal INB is logically low.

Each of a drain of PMOS transistor P10, a drain of NMOS transistor N10, an input terminal of inverter I1, the drain of PMOS transistor P8 and the drain of NMOS transistor N8 are coupled to each other. The drain of PMOS transistor P10, the drain of NMOS transistor N10 and the input terminal of inverter I1 are configured to receive signal INB at a node NODE_6.

A gate of PMOS transistor P10 is configured to receive sense amplifier enable signal SAE. Sense amplifier enable signal SAE turns on or off PMOS transistor P10. A source of PMOS transistor P10 is coupled with a drain of PMOS transistor P11. A source of PMOS transistor P11 is coupled to and receives supply voltage VDD.

A gate of NMOS transistor N10 is configured to receive sense amplifier enable signal SAEP. Sense amplifier enable signal SAEP turns on or off NMOS transistor N10. A source of NMOS transistor N10 is coupled with a drain of NMOS transistor N11. A source of NMOS transistor N11 is coupled to and receives reference voltage VSS.

Inverter I1 is configured to receive signal INB, and to output signal OUT. An input terminal of inverter I1 is coupled to the drain of PMOS transistor P10, the drain of NMOS transistor N10, the drain of PMOS transistor P8 and the drain of NMOS transistor N8. The input terminal of inverter I1 is configured to receive signal INB. An output terminal of inverter I1 is coupled with the gates of PMOS transistor P11 and a gate of NMOS transistor N11. The output terminal of inverter I1 is configured to output signal OUT responsive to signal INB. Signal OUT is inverted from signal INB.

A gate of NMOS transistor N11, a gate of PMOS transistor P11 and the output terminal of inverter I1 are coupled together. The gate of NMOS transistor N11 and the gate of PMOS transistor P11 are configured to receive signal OUT. Signal OUT turns PMOS transistor P11 off or on, and turns NMOS transistor N11 on or off, respectively.

In some embodiments, when sense amplifier enable signal SAE is logically low, sense amplifier enable signal SAEP is logically high, and vice versa.

PMOS transistor P10 and NMOS transistor N10 are configured to be turned on or turned off at the same time. In contrast, PMOS transistor P11 and NMOS transistor N11 are configured to be turned on or turned off in a complementary manner.

For example, when sense amplifier enable signal SAE is logically low causes PMOS transistor P10 to be on, and sense amplifier enable signal SAEP is logically high causes NMOS transistor N10 to be on, thereby coupling the drain of NMOS transistor N11 and the drain of PMOS transistor P11 to node NODE_6. When signal INB is logically low, then signal OUT is logically high causing NMOS transistor N11 to be turned on, and node NODE_6 is pulled to reference voltage VSS by NMOS transistors N10 and N11. When signal INB is logically high, then signal OUT is logically low causing PMOS transistor P11 to be turned on, and node NODE_6 is pulled to supply voltage VDD by PMOS transistors P10 and P11.

In contrast, when sense amplifier enable signal SAE is logically high causes PMOS transistor P10 to be off thereby disconnecting the drain of PMOS transistor P11 from node NODE_6, and when sense amplifier enable signal SAEP is logically low causes NMOS transistor N10 to be off, thereby disconnecting the drain of NMOS transistor N11 from node NODE_6.

Other quantities or configurations of inverter I1, one or more NMOS transistors N8, N9, N10, N11 and/or PMOS transistors P8, P9, P10, P11 are within the scope of the present disclosure. Latch circuit 500 is used for illustration. Other circuits with function similar to latch circuit 500 are within the contemplated scope of the present disclosure.

Waveforms

Figure 6:
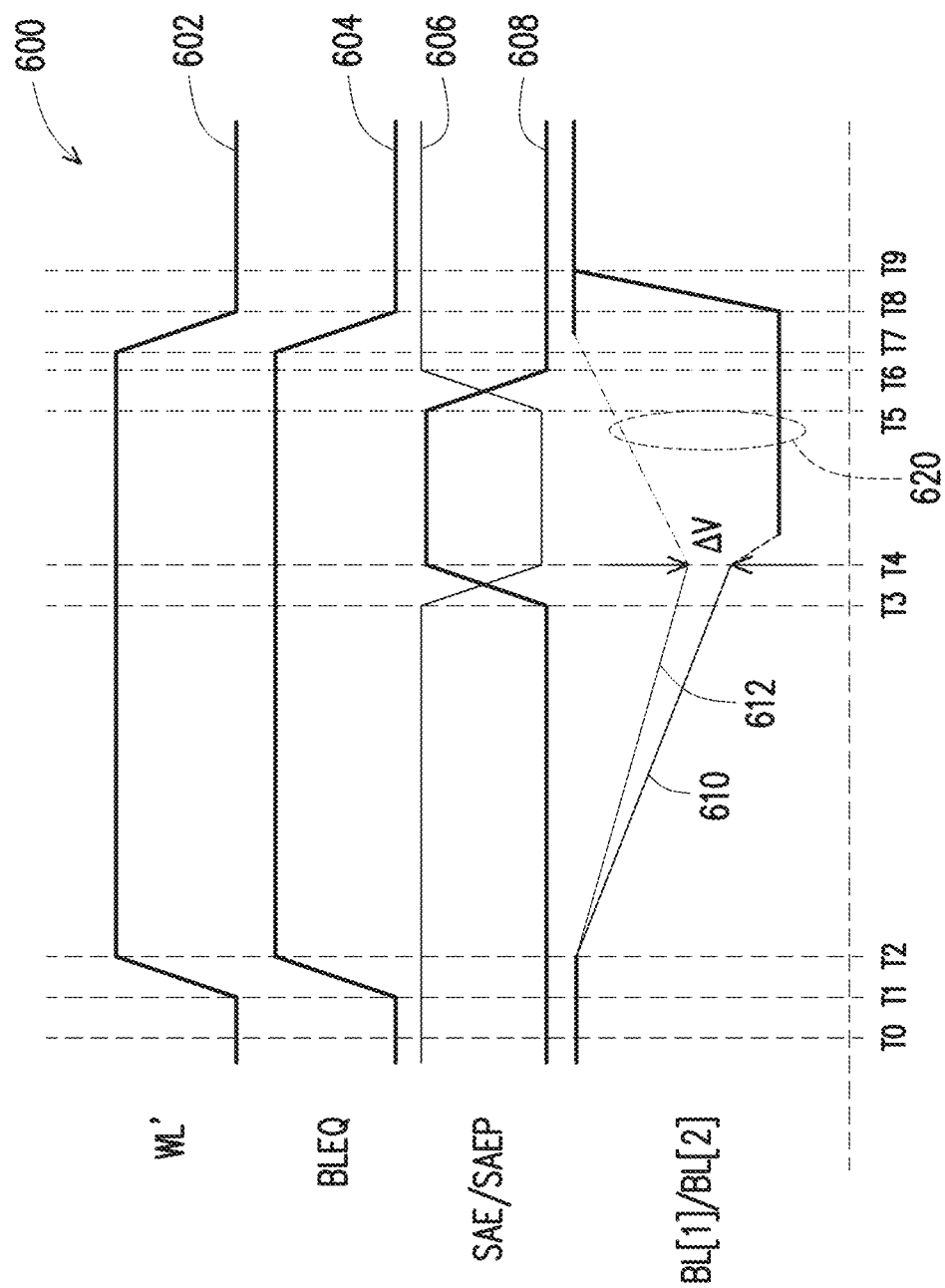
FIG. 6 is a graph of waveforms, in accordance with some embodiments.

FIG. 6 is a graph of waveforms 600, in accordance with some embodiments. Waveforms 600 include waveforms of signals in a read operation of memory cells 102a and 102b performed by sense amplifier 404 of FIG. 4. In this illustration, initially, memory cells 102a and 102b each store a low logical value. In this illustration, voltage VBL is equal to supply voltage VDD.

In some embodiments, curve 602 represents word line signal WL' of word line WL[1] of FIG. 4; curve 604 represents signal BLEQ received by pre-charge and equalization circuit 402; curve 606 represents sense amplifier enable signal SAEP received by sense amplifier 404; curve 608 represents sense amplifier enable signal SAE received by sense amplifier 404; curve 610 represents bit line signal BL[1]; and curve 612 represents bit line signal BL[2].

At time T0, curve 604 is a low logical value causing pre-charge and equalization circuit 402 to be turned on. As a result, bit lines BL[1] and BL[2] are pre-charged to a high logical value by pre-charge and equalization circuit 402.

At time T0, curve 602 is a low logical value causing NMOS transistors N3 and N4 in each of memory cell 102a and 102b to be turned off, and the bit lines BL[1] and BL[2] are not connected to the corresponding memory cells 102a and 102b.

At time T1, curves 602 and 604 transition from a low logical value to a high logical value causing NMOS transistors N3 and N4 in each of memory cell 102a and 102b to begin to turn on, and causing PMOS transistors P3a, P3b and P4 in pre-charge and equalization circuit 402 to begin to turn off.

At time T2, curves 602 and 604 are a high logical value, and curves 610 and 612 transition from a high logical value to a low logical value. As a result of curve 602, NMOS transistors N3 in each of memory cell 102a and 102b are turned on causing bit lines BL[1] and BL[2] to be connected to corresponding memory cells 102a and 102b. As a result of curve 604, PMOS transistors P3a, P3b and P4 in pre-charge and equalization circuit 402 are turned off. As a result of curves 610 and 612 transitioning from a high logical value to a low logical value, PMOS transistors P5 and P6 are slightly turned on. However, PMOS transistors P5 and P6 do not pull bit lines BL[1] and BL[2] towards logically high since PMOS transistor P7 is turned off.

At time T3, curve 606 transitions from a high logical value to a low logical value, and curve 608 transitions from a low logical value to a high logical value. As a result, NMOS transistor N7 and PMOS transistor P7 begin to turn on causing sense amplifier 404 to begin to turn on.

At time T4, curve 608 is a high logical value, and curve 606 is a low logical value. As a result, NMOS transistor N7 is turned on by sense amplifier enable signal SAE and a current path is provided for between node NODE_4 and reference supply voltage VSS. Similarly, PMOS transistor P7 is turned on by sense amplifier enable signal SAEP and a current path is provided for between nodes NODE_2 and NODE_3. In other words, sense amplifier 404 is turned on. In some embodiments, sense amplifier 404 is turned on and pulls bit line BL[1] towards supply reference voltage VSS, and pulls bit line BL[2] towards supply voltage VDD. In some embodiments, sense amplifier 404 is turned on and pulls bit line BL[1] towards supply voltage VDD, and pulls bit line BL[2] towards supply reference voltage VSS.

In some embodiments, sense amplifier 404 is activated or turned on by sense amplifier enable signal SAE or SAEP after the data split between bit line BL[1] and BL[2] is greater than a predetermined value $\Delta V$. In some embodiments, at time T4, a difference between curve 610 and 612 is substantially equal to the predetermined value $\Delta V$.

In some embodiments, at time T4, a value of the voltage of bit line BL[1], as represented by curve 610, is less than or equal to a threshold voltage Vth of the sense amplifier 404 minus the predetermined value $\Delta V$. In some embodiments, at time T4, a value of the voltage of bit line BL[2], as represented by curve 612, is less than or equal to the threshold voltage Vth of the sense amplifier 404. Thus, in some embodiments, the sense amplifier 404 is turned on after the voltage of the bit lines BL[1] or BL[2] is less than the threshold voltage Vth of the sense amplifier 404. In other words, sense amplifier 404 is configured to have a bias point less than the threshold voltage Vth of the sense amplifier 404. As shown in FIG. 6, an oval 620 shows the difference between curve 610 and 612 (e.g., the predetermined value $\Delta V$) right before time T5. For example, right before time T5, bit line BL[1] is pulled towards supply reference voltage VSS by NMOS transistor N7, and bit line BL[2] is pulled towards supply voltage VDD by PMOS transistor P7 causing the predetermined value $\Delta V$ to increase resulting in better read margin for sense amplifier 404 than other approaches. In some embodiments, by using big PMOS transistors for one or more of PMOS transistors P5, P6 and P7, the predetermined value $\Delta V$ of sense amplifier 404 is larger than other approaches yielding better read margin.

At time T5, curve 608 transitions from a high logical value to a low logical value, and curve 606 transitions from a low logical value to a high logical value. As a result, NMOS transistor N7 and PMOS transistor P7 begin to turn off causing sense amplifier 404 to begin to turn off.

At time T6, curve 608 is a low logical value, and curve 606 is a high logical value. As a result, NMOS transistor N7 is turned off by sense amplifier enable signal SAE and PMOS transistor P7 is turned off by sense amplifier enable signal SAEP. In other words, sense amplifier 404 is turned off.

At time T7, curves 602 and curve 604 transition to a low logical value. The transition of curve 602 to a low logical value causes NMOS transistors N3 in each of memory cell 102a and 102b to be turned off causing bit lines BL[1] and BL[2] to be disconnected from corresponding memory cells 102a and 102b. The transition of curve 604 to a low logical value causes pre-charge and equalization circuit 402 to be turned on.

At time T8, curve 604 is a low logical value and curves 610 and 612 transition to a high logical value. The transition of curve 604 to a low logical value causes pre-charge and equalization circuit 402 to be turned on. As pre-charge and equalization circuit 402 begins to turn on, pre-charge and equalization circuit 402 begins to pre-charge bit lines BL[1] and BL[2] to a high logical value (as shown by curves 610 and 612). In other words, turning on pre-charge and equalization circuit 402 causes curves 610 and 612 to transition to a high logical value.

At time T9, curves 610 and 612 are a high logical value. In other words, bit lines BL[1] and BL[2] are pre-charged to the high logical value.

Method

Figure 7:
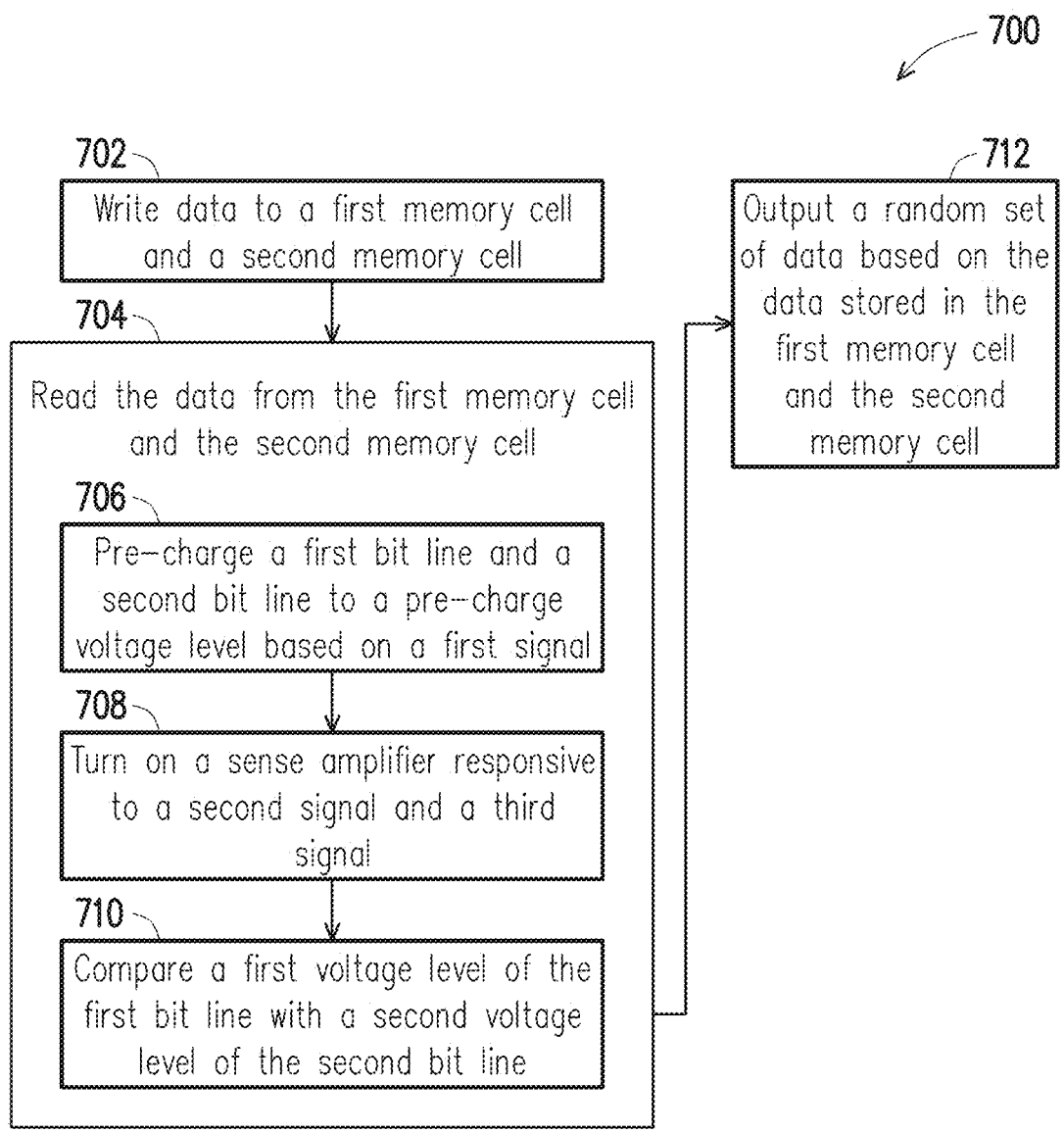
FIG. 7 is a flowchart of a method of operating a sense amplifier, in accordance with some embodiments.

FIG. 7 is a flowchart of a method 700 of operating a sense amplifier 404 of a memory circuit 400 in accordance with some embodiments. It is understood that additional operations may be performed before, during, and/or after the method 700 depicted in FIG. 7, and that some other operations may only be briefly described herein, and one or more operations in FIG. 7 are omitted.

In some embodiments, method 700 is usable to operate a sense amplifier, such as one or more sense amplifiers in set of sense amplifiers 106 (FIG. 1), or sense amplifier 304 (FIG. 3) (FIG. 3) or sense amplifier 404 (FIG. 4). In the following operations, references are made to FIGS. 1, 2 and 4. For illustration, node ND in FIG. 2 stores a low logical value while node NDB stores a high logical value.

In operation 702 of method 700, data is written to a first memory cell (e.g., memory cell 102a) and a second memory cell (e.g., memory cell 102b). In some embodiments, operation 702 includes writing a first logical value to memory cell 102a, and writing the first logical value to memory cell 102b. In some embodiments, operation 702 includes writing a logical low to each of the memory cell 102a and the memory cell 102b. In some embodiments, operation 702 includes writing a logical high to each of the memory cell 102a and the memory cell 102b.

In operation 704 of method 700, data is read from the first memory cell (e.g., memory cell 102a) and the second memory cell (e.g., memory cell 102b). In some embodiments, operation 704 comprises one or more of operations 706, 708 and 710.

In operation 706 of method 700, a first bit line BL[1] and a second bit line BL[2] are pre-charged, by a pre-charge and equalization circuit 404, to a pre-charge voltage level based on a first signal (e.g., signal BLEQ). In some embodiments, the pre-charge voltage level is voltage VBL. In some embodiments, voltage VBL is equal to supply voltage VDD. In some embodiments, voltage VBL is equal to supply reference voltage VSS.

In some embodiments, operation 706 comprises turning on PMOS transistor P3a responsive to the first signal (BLEQ) thereby pulling the first bit line BL[1] towards the pre-charge voltage level, turning on PMOS transistor P3b responsive to the first signal (BLEQ) thereby pulling the second bit line BL[2] towards the pre-charge voltage level, and turning on PMOS transistor P4 responsive to the first signal (BLEQ) thereby coupling the first bit line BL[1] and the second bit line BL[2].

In operation 708 of method 700, a sense amplifier 404 is turned on responsive to a second signal (e.g., signal SAE) and a third signal (e.g., signal SAEP). In some embodiments, the second signal (SAE) and the third signal (SAEP) are different from the first signal (BLED). In some embodiments, operation 708 comprises turning on NMOS transistor N7 responsive to the second signal (SAE) thereby pulling a node NODE_4 towards a first voltage level (VSS), and turning on a PMOS transistor P7 responsive to the third signal (SAEP) thereby pulling a node NODE_4 towards a second voltage level (VDD) different from the first voltage level (VSS).

In operation 710 of method 700, a first voltage level of the first bit line BL[1] is compared with a second voltage level of the second bit line BL[2]. In some embodiments, operation 710 is performed by sense amplifier 404. In some embodiments, operation 710 comprises sense amplifier 404 outputting a first logical value (logical low) if the first bit line BL[1] is pulled towards a first voltage level (VSS) faster than the second bit line BL[2] is pulled towards the first voltage level (VSS). In some embodiments, operation 710 comprises sense amplifier 404 outputting a second logical value (logical high) if the first bit line BL[1] is pulled towards the first voltage level (VSS) slower than the second bit line BL[2] is pulled towards the first voltage level (VSS). In some embodiments, the second logical value (logical high) is different from the first logical value (logical low). Other configurations or values output by sense amplifier 404 are within the scope of the present disclosure.

In operation 712 of method 700, a random set of data Q is output, by latch circuit 500, based on the data stored (e.g., logical low) in the first memory cell 102a and the second memory cell 102b. In some embodiments, operation 712 includes one or more of the operations described with respect to latch circuit 500 of FIG. 5.

In some embodiments, operation 712 includes turning on PMOS transistor P9 thereby coupling the source of PMOS transistor P8 to supply voltage VDD, and turning on NMOS transistor N9 thereby coupling the source of NMOS transistor N8 to reference voltage VSS. In some embodiments, operation 712 includes turning on PMOS transistor P8 to thereby pull node NODE_5 to supply voltage VDD by PMOS transistors P8 and P9. In some embodiments, operation 712 includes turning on NMOS transistor N8 to thereby pull node NODE_5 to reference voltage VSS by NMOS transistors N8 and N9.

In some embodiments, operation 712 includes turning on PMOS transistor P10 thereby coupling the drain of PMOS transistor P11 to node NODE_6, and turning on NMOS transistor N10 thereby coupling the drain of NMOS transistor N11 to node NODE_6. In some embodiments, operation 712 includes turning on PMOS transistors P10 and P11 thereby pulling node NODE_6 to supply voltage VDD by PMOS transistors P10 and P11. In some embodiments, operation 712 includes turning on NMOS transistors N10 and N11 thereby pulling node NODE_6 to reference voltage VSS by NMOS transistors N10 and N11.

In some embodiments, method 700 includes a method of operating sense amplifier 304, 404 to generate a random number (e.g., output signal Q) based on data read from memory cells 102a and 102b of memory circuit 400. In some embodiments, method 700 is performed by each sense amplifier of the set of sense amplifiers 106 to generate a corresponding random number (e.g., signal Q[1], ..., Q[X]) of the set of data Q based on data read from a corresponding pair of memory cells of memory cell array 102 in memory circuit 100.

In some embodiments, the first memory cell or the second memory cell of method 700 includes one or more memory cells MCB in memory array 102 or memory cell 200. In some embodiments, the sense amplifier of method 700 includes one or more of set of sense amplifiers 106 or 304. In some embodiments, the pre-charge and equalization circuit of method 700 includes one or more of pre-charge and equalization circuit 110 or 302. In some embodiments, the latch circuit of method 700 includes one or more of latch circuit 108 or 306.

In some embodiments, a circuit (e.g., sense amplifier 404) using method 700 has better read margin than other approaches.

One aspect of this description relates to a memory circuit. A memory circuit includes a first memory cell, a second memory cell and a sense amplifier. In some embodiments, the first memory cell is coupled to a first bit line. In some embodiments, the second memory cell is coupled to a second bit line. In some embodiments, the sense amplifier is coupled to the first memory cell by the first bit line, and coupled to the second memory cell by the second bit line. In some embodiments, the sense amplifier is responsive to a first signal and a second signal. In some embodiments, the sense amplifier includes a header switch coupled to a first node and a first supply voltage, and configured to provide the first supply voltage to the sense amplifier responsive to the first signal, the header switch having a first size. In some embodiments, the sense amplifier further includes a footer switch coupled to a second node and a second supply voltage different from the first supply voltage, the footer switch having a second size, the first size being greater than the second size. In some embodiments, the sense amplifier further includes a first cross-coupled inverter coupled to the first bit line, and a second cross-coupled inverter coupled to the second bit line. In some embodiments, the first size includes a first number of fins or a first channel width, and the second size includes a second number of fins or a second channel width.

Another aspect of this description relates to a memory circuit. The memory circuit includes a word line, a first bit line, a second bit line, a memory array and an input output circuit. In some embodiments, the memory array has a first memory cell and a second memory cell arranged in a first row, the first memory cell and the second memory cell being coupled to the word line. In some embodiments, the input output circuit includes a sense amplifier coupled to the first memory cell by the first bit line, and coupled to the second memory cell by the second bit line, the sense amplifier being responsive to a first sense amplifier signal and a second sense amplifier signal different from the first sense amplifier signal. In some embodiments, the sense amplifier includes a header switch having a first size and being coupled between a first node and a first supply voltage, and a footer switch having a second size and being coupled between a second node and a second supply voltage different from the first supply voltage, the first size being greater than the second size. In some embodiments, the first size includes a first number of fins or a first channel width, and the second size includes a second number of fins or a second channel width.

Still another aspect of this disclosure relates to a method of operating a sense amplifier. In some embodiments, the method includes writing data to a first memory cell and a second memory cell, and reading the data from the first memory cell and the second memory cell. In some embodiments, reading the data includes pre-charging, by a pre-charge circuit, a first bit line and a second bit line to a pre-charge voltage level based on a first signal, the pre-charge voltage level corresponding to a first logical value, the pre-charge circuit being coupled to the first bit line and the second bit line. In some embodiments, reading the data further includes turning on the sense amplifier responsive to a second signal and a third signal, the second signal and the third signal being different from each other. In some embodiments, the method further includes outputting a set of data based on the data stored in the first memory cell and the second memory cell that are reflected on the first bit line and the second bit line, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
    a first memory cell coupled to a first bit line;
    a second memory cell coupled to a second bit line; and
    a sense amplifier coupled to the first memory cell by the first bit line, and coupled to the second memory cell by the second bit line, the sense amplifier being responsive to a first signal and a second signal, the sense amplifier comprising:
    a header switch coupled to a first node and a first supply voltage, and configured to provide the first supply voltage to the sense amplifier responsive to the first signal, the header switch having a first size;
    a footer switch coupled to a second node and a second supply voltage different from the first supply voltage, the footer switch having a second size, the first size being greater than the second size;
    a first cross-coupled inverter coupled to the first bit line; and
    a second cross-coupled inverter coupled to the second bit line;
    wherein the first size includes a first number of fins or a first channel width; and
    the second size includes a second number of fins or a second channel width.

2. The memory circuit of claim 1, wherein the header switch comprises a P-type transistor comprising:
    a gate of the P-type transistor configured to receive the first signal,
    a source of the P-type transistor being coupled to the first supply voltage, and
    a drain of the P-type transistor being coupled to the first node.

3. The memory circuit of claim 2, wherein the footer switch comprises an N-type transistor comprising:
    a gate of the N-type transistor configured to receive the second signal,
    a source of the N-type transistor being coupled to the second supply voltage, and
    a drain of the N-type transistor being coupled to the second node.

4. The memory circuit of claim 1, wherein
    the first cross-coupled inverter includes a first set of transistors of a first type and a second type, the first set of transistors having a third size; and
    the second cross-coupled inverter includes a second set of transistors of the first type and the second type, the first set of transistors having the third size.

5. The memory circuit of claim 4, wherein
    the first type is P-type transistors; and
    the second type is N-type transistors.

6. The memory circuit of claim 1, further comprising:
    a latch coupled to the sense amplifier by the first bit line, and being configured to output a random set of data based on data stored in the first memory cell and the second memory cell.

7. The memory circuit of claim 6, wherein the latch comprises:
    a first transistor of a first type comprising:
        a gate of the first transistor being configured to receive the first signal;
        a drain of the first transistor being coupled to at least a third node; and
        a source of the first transistor being coupled to the first supply voltage;
    a second transistor of a second type comprising:
        a gate of the second transistor being configured to receive the second signal;
        a drain of the second transistor being coupled to a fourth node; and
        a source of the second transistor being coupled to the second supply voltage;
    a third transistor of the first type comprising:
        a gate of the third transistor being configured to receive a first data signal, and being coupled to at least a first input node;
        a source of the third transistor being coupled to the third node and the drain of the first transistor; and
        a drain of the third transistor being coupled to at least a first output node; and
    a fourth transistor of the second type comprising:
        a gate of the fourth transistor being configured to receive the first data signal, and being coupled to the first input node and the gate of the third transistor;
        a source of the fourth transistor being coupled to the fourth node and the drain of the second transistor; and
        a drain of the fourth transistor being coupled to the first output node and the drain of the third transistor.

8. The memory circuit of claim 7, wherein the latch further comprises:
- a fifth transistor of the first type comprising:
  - a gate of the fifth transistor being configured to receive the second signal;
  - a drain of the fifth transistor being coupled to at least the first output node; and
  - a source of the fifth transistor being coupled to at least a fifth node;
- a sixth transistor of the second type comprising:
  - a gate of the sixth transistor being configured to receive the first signal;
  - a drain of the sixth transistor being coupled to at least the first output node and the drain of the fifth transistor; and
  - a source of the sixth transistor being coupled to at least a sixth node;
- a seventh transistor of the first type comprising:
  - a gate of the seventh transistor being configured to receive a data signal of the random set of data, and being coupled to at least a second output node;
  - a source of the seventh transistor being coupled to the first supply voltage; and
  - a drain of the seventh transistor being coupled to the fifth node and the source of the fifth transistor; and
- an eighth transistor of the second type comprising:
  - a gate of the eighth transistor being configured to receive the data signal of the random set of data, and being coupled to at least the second output node and the gate of the seventh transistor;
  - a source of the eighth transistor being coupled to the second supply voltage; and
  - a drain of the eighth transistor being coupled to the sixth node and the source of the sixth transistor.

9. The memory circuit of claim 8, wherein the latch further comprises:
- an inverter comprising an input terminal coupled to at least the drain of the fifth transistor, the drain of the sixth transistor and the first output node, and an output terminal coupled to the gate of the seventh transistor, the gate of the eighth transistor and the second output node.

10. The memory circuit of claim 1, wherein the first memory cell and the second memory cell are logic devices.

11. A memory circuit comprising:
- a word line;
- a first bit line;
- a second bit line;
- a memory array having a first memory cell and a second memory cell arranged in a first row, the first memory cell and the second memory cell being coupled to the word line; and
- an input output circuit comprising:
  - a sense amplifier coupled to the first memory cell by the first bit line, and coupled to the second memory cell by the second bit line, the sense amplifier being responsive to a first sense amplifier signal and a second sense amplifier signal different from the first sense amplifier signal, the sense amplifier comprising:
    - a header switch having a first size and being coupled between a first node and a first supply voltage; and
    - a footer switch having a second size and being coupled between a second node and a second supply voltage different from the first supply voltage, the first size being greater than the second size;

wherein the first size includes a first number of fins or a first channel width; and
the second size includes a second number of fins or a second channel width.

12. The memory circuit of claim 11, wherein
the header switch comprises a first P-type transistor having the first size;
the footer switch comprises a first N-type transistor having the second size; and
the sense amplifier further comprises:
- a first cross-coupled inverter comprising:
  - a second P-type transistor having a third size; and
  - a second N-type transistor having the third size; and
- a second cross-coupled inverter comprising:
  - a third P-type transistor having the third size; and
  - a third N-type transistor having the third size.

13. The memory circuit of claim 11, wherein
the header switch comprises a P-type transistor comprising:
- a gate terminal of the P-type transistor configured to receive the first sense amplifier signal,
- a source terminal of the P-type transistor being coupled to the first supply voltage, and
- a drain terminal of the P-type transistor being coupled to the first node; and
the footer switch comprises an N-type transistor comprising:
- a gate terminal of the N-type transistor configured to receive the second sense amplifier signal,
- a source terminal of the N-type transistor being coupled to the second supply voltage, and
- a drain terminal of the N-type transistor being coupled to the second node.

14. The memory circuit of claim 11, wherein the first memory cell and the second memory cell are static random access memory (SRAM) cells.

15. The memory circuit of claim 11, wherein the input output circuit further comprises:
- a latch coupled to the sense amplifier by the first bit line, and being configured to output a random set of data based on data stored in the first memory cell and the second memory cell.

16. A method of operating a sense amplifier, the method comprising:
- writing data to a first memory cell and a second memory cell;
- reading the data from the first memory cell and the second memory cell, wherein reading the data comprises:
  - pre-charging, by a pre-charge circuit, a first bit line and a second bit line to a pre-charge voltage level based on a first signal, the pre-charge voltage level corresponding to a first logical value, the pre-charge circuit being coupled to the first bit line and the second bit line; and
  - turning on the sense amplifier responsive to a second signal and a third signal, the second signal and the third signal being different from each other; and
- outputting a set of data based on the data stored in the first memory cell and the second memory cell that are reflected on the first bit line and the second bit line, respectively.

17. The method of claim 16, wherein pre-charging the first bit line and the second bit line comprises:
- turning on a first transistor responsive to the first signal thereby pulling the first bit line towards the pre-charge voltage level; and turning on a second transistor responsive to the first signal thereby pulling the second bit line towards the pre-charge voltage level.

18. The method of claim 17, wherein pre-charging the first bit line and the second bit line further comprises:
turning on a third transistor responsive to the first signal thereby coupling the first bit line and the second bit line.

19. The method of claim 16, wherein writing data to the first memory cell and the second memory cell comprises:
writing a second logical value to the first memory cell; and
writing the second logical value to the second memory cell.

20. The method of claim 16, wherein turning on the sense amplifier responsive to the second signal and the third signal comprises:
turning on a first transistor responsive to the second signal thereby pulling a first node towards a first voltage level, the first transistor being coupled between the first node and a first voltage supply node having the first voltage level; and
turning on a second transistor responsive to the third signal thereby pulling a second node towards a second voltage level different from the first voltage level, the second transistor being coupled between the second node and a second voltage supply node having the second voltage level.

* * * * *